(12) United States Patent
Kwon et al.

(10) Patent No.: US 11,094,908 B2
(45) Date of Patent: Aug. 17, 2021

(54) LIGHTING APPARATUS USING ORGANIC LIGHT EMITTING DIODE

(71) Applicant: LG Display Co., Ltd., Seoul (KR)

(72) Inventors: Juhyuk Kwon, Seoul (KR); Jaemin Moon, Seoul (KR); Sunhee Lee, Incheon (KR); Taemin Kim, Incheon (KR); JunHyoung Lee, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 48 days.

(21) Appl. No.: 16/716,223

(22) Filed: Dec. 16, 2019

(65) Prior Publication Data

US 2020/0203649 A1 Jun. 25, 2020

(30) Foreign Application Priority Data

Dec. 20, 2018 (KR) ........................ 10-2018-0166018

(51) Int. Cl.
*H01L 51/50* (2006.01)
*H01L 51/52* (2006.01)
*H01L 27/32* (2006.01)

(52) U.S. Cl.
CPC ........ *H01L 51/504* (2013.01); *H01L 51/5016* (2013.01); *H01L 51/5209* (2013.01); *H01L 51/5221* (2013.01); *H01L 27/3206* (2013.01)

(58) Field of Classification Search
CPC . H01L 51/504; H01L 51/5044; H01L 51/506; H01L 51/5064; H01L 51/5206; H01L 51/5212; H01L 51/5218; H01L 51/5228; H01L 51/441; H01L 51/445; H01L 51/448; H01L 51/5024; H01L 51/5036; H01L 51/5209; H01L 51/5016; H01L 51/5221; H01L 27/3206; H01L 27/3209; H01L 27/3211; H01L 27/3244; H01L 27/3279; H01L 51/5278; H01L 2251/50; H01L 2251/53; H01L 2251/5307; H01L 2251/5323; H01L 2251/533; H01L 2251/5338; H01L 2251/5243; H01L 2251/5253; H01L 2251/5262; H01L 2251/5346; H01L 2251/5361; H01L 2251/5376; H01L 2251/558; H01L 2251/5384; H01L 51/0087; H01L 51/5004;

(Continued)

(56) References Cited

U.S. PATENT DOCUMENTS

2013/0328038 A1* 12/2013 Taneda ................... C09K 11/06
257/40
2015/0287949 A1* 10/2015 Okamoto ............ H01L 51/5044
257/40

(Continued)

FOREIGN PATENT DOCUMENTS

KR   10-2015-0002265 A   1/2015

*Primary Examiner* — Natalia A Gondarenko
(74) *Attorney, Agent, or Firm* — Polsinelli PC

(57) ABSTRACT

An organic light emitting diode comprises an anode; an organic layer disposed on the anode and including a plurality of phosphorescent light emitting layers; and a cathode disposed on the organic layer, wherein a phosphorescent light emitting layer having a highest degree of horizontal orientation of a dopant among the plurality of phosphorescent light emitting layers is disposed to be adjacent to the cathode, and wherein the anode includes a short reduction pattern which implements a narrow path.

15 Claims, 7 Drawing Sheets

(58) Field of Classification Search
CPC ............ H01L 51/5203; H01L 51/5253; H01L 51/5262
USPC ................................ 257/40, 98, 99, 89, 100
See application file for complete search history.

(56) References Cited

U.S. PATENT DOCUMENTS

2015/0303405 A1* 10/2015 Okumura ............ H01L 51/5203
 257/40
2016/0322430 A1* 11/2016 Kawato ............... H01L 27/3211

* cited by examiner

LIGHTING APPARATUS USING ORGANIC LIGHT EMITTING DIODE

CROSS REFERENCE TO RELATED APPLICATION

This application claims the priority of Korean Patent Application No. 10-2018-0166018 filed on Dec. 20, 2018, which is hereby incorporated by reference in its entirety.

BACKGROUND

Field of the Disclosure

The present disclosure relates to a lighting apparatus using an organic light emitting diode, and more particularly, to a lighting apparatus using an organic light emitting diode with improved luminous efficiency.

Description of the Background

Currently, fluorescent lamps or incandescent lamps are mainly used as lighting apparatuses. Among them, the incandescent lamps have a good color rendering index (CRI) but have very low energy efficiency. Further, the fluorescent lamps have good efficiency, but have a low color rendering index and contain mercury, which may cause an environmental problem.

The color rendering index is an index representing color reproduction. In other words, the color rendering index represents how much a feeling of a color of an object illuminated by a specific light source is similar to a feeling of a color of the object illuminated by a reference light source. A CRI of sunlight is 100.

In order to solve the problems of the lighting apparatus of the related art, recently, a light emitting diode (LED) is suggested as a lighting apparatus. The light emitting diode is formed of an inorganic light emitting material. Luminous efficiency of the light emitting diode is the highest in the red wavelength range and the luminous efficiency thereof is lowered toward a red wavelength range and a green wavelength range which has the highest visibility. Therefore, there is a disadvantage in that when a red light emitting diode, a green light emitting diode, and a blue light emitting diode are combined to emit white light, the luminous efficiency is lowered.

As another alternative, a lighting apparatus using an organic light emitting diode (OLED) has been developed. The organic light emitting diode is configured by an anode, a plurality of organic layers, and a cathode which are sequentially formed on a substrate.

However, light emitted from the plurality of organic layers is trapped at an interface of the plurality of organic layers and the cathode and is partially decayed, which results in the lowering of the luminous efficiency of the lighting apparatus.

SUMMARY

An object to be achieved by the present disclosure is to provide a lighting apparatus using an organic light emitting diode with improved luminous efficiency.

Another object to be achieved by the present disclosure is to provide a lighting apparatus using an organic light emitting diode in which light lost at the interface of the organic layers and the cathode is minimized.

Objects of the present disclosure are not limited to the above-mentioned objects, and other objects, which are not mentioned above, can be clearly understood by those skilled in the art from the following descriptions.

In order to solve the above-described problems, according to an aspect of the present disclosure, a lighting apparatus uses an organic light emitting diode, the organic light emitting diode comprises: an anode; an organic layer disposed on the anode and including a plurality of phosphorescent light emitting layers; and a cathode disposed on the organic layer, wherein a phosphorescent light emitting layer having a highest degree of horizontal orientation of a dopant among the plurality of phosphorescent light emitting layers is disposed to be adjacent to the cathode, wherein the anode includes a short reduction pattern which implements a narrow path. Therefore, the emission efficiency of the lighting apparatus may be improved.

According to another aspect of the present disclosure, a lighting apparatus uses a three-stack tandem type organic light emitting diode, a first stack adjacent to a transparent electrode includes a green phosphorescent light emitting layer, a third stack adjacent to a reflective electrode includes a red phosphorescent light emitting layer, and a second stack disposed between the first stack and the third stack includes a blue fluorescent light emitting layer. Therefore, the emission efficiency of the lighting apparatus may be improved.

Other detailed matters of the exemplary aspects are included in the detailed description and the drawings.

According to the present disclosure, a phosphorescent light emitting layer having a high degree of horizontal orientation is disposed to be adjacent to a reflective electrode to minimize a surface plasmon polariton loss, thereby improving luminous efficiency of a lighting apparatus.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
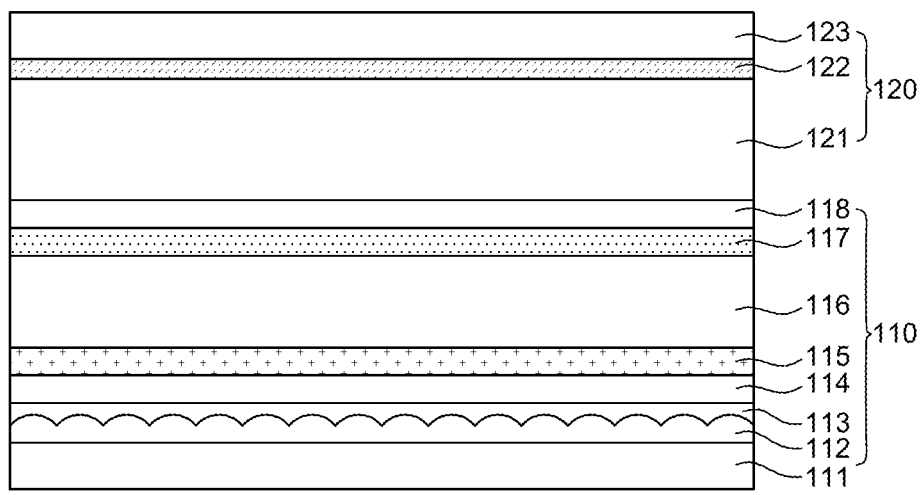
FIG. 1 is a cross-sectional view illustrating a lighting apparatus using an organic light emitting diode according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, other layer or element may be interposed therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a light apparatus according to exemplary aspects of the present disclosure will be described in detail with reference to accompanying drawings.

FIG. 1 is a cross-sectional view illustrating a lighting apparatus using an organic light emitting diode according to an exemplary aspect of the present disclosure.

In the present disclosure, provided is a lighting apparatus using an organic light emitting diode formed of an organic material, rather than a lighting apparatus using an inorganic light emitting diode formed of an inorganic material.

Luminous efficiency of green and red light of the organic light emitting diode formed of an organic light emitting material is relatively better than that of an inorganic light emitting diode. Further, the organic light emitting diode has a relatively wider width of an emission peak of red, green, and blue light as compared with the inorganic light emitting diode, so that the color rendering index (CRI) is improved so that the light of the lighting apparatus is more similar to the sunlight.

Referring to FIG. 1, a lighting apparatus 100 using an organic light emitting diode according to an exemplary aspect of the present disclosure includes an organic light emitting diode unit 110 which performs surface emission and an encapsulating unit 120 which encapsulates the organic light emitting diode unit 110.

Specifically, the organic light emitting diode unit 110 may sequentially include a substrate 111, an internal light extracting layer 112, a planarizing layer 113, a barrier layer 114, a first electrode 115, an organic layer 116, and a second electrode 117 from the lower side.

An external light extracting layer 118 for increasing a haze may be additionally provided above the organic light emitting diode unit 110. However, the present disclosure is not limited thereto and the lighting apparatus 100 of the present disclosure may not include the external light extracting layer. Here, the external light extracting layer 118 is configured such that scattering particles such as $TiO_2$ are dispersed in a resin and may be attached above a substrate 111 by means of an adhesive layer (not illustrated).

In addition, as it will be described below with reference to FIGS. 3B and 4, the organic light emitting diode unit 110 may further include an auxiliary line AL for compensating conductivity of the first electrode 115 and an insulating layer INS for suppressing the short of the first electrode 115 and the second electrode 117.

The substrate 111 may be formed of a transparent glass. Further, the substrate 111 may be formed of a polymer material having flexibility such as polyimide.

Here, the organic layer 116 which emits light and the first electrode 115 and the second electrode 117 which are disposed on and below the organic layer 116 to supply charges to the organic layer 116 may form an organic light emitting diode (OLED).

For example, the first electrode 115 may be an anode which supplies holes to the organic layer 116 and the second electrode 117 may be a cathode which supplies electrons to the organic layer 116, but are not limited thereto and the functions of the first electrode 115 and the second electrode 117 may be switched.

Generally, the first electrode 115 may be formed of indium tin oxide (ITO) or indium zinc oxide (IZO) which is a transparent metal oxide material having a high work function and good conductivity or a thin metal film to easily inject the holes. Here, a specific example of the thin metal film may be formed of a metal such as magnesium (Mg), calcium (Ca), sodium (Na), titanium (Ti), indium (In), yttrium (Y), lithium (Li), gadolinium (Gd), aluminum (Al), silver (Ag), tin (Sn) and lead (Pb), or an alloy thereof. The first electrode 115 may be configured by a single stack or may also be configured by a multi-stack formed of the above-mentioned materials.

Further, the second electrode 117 is desirably formed of a conductive material having a low work function so as to easily inject electrons to the organic layer 116. A specific example of a material used for the second electrode 117 may be formed of a metal such as magnesium (Mg), calcium (Ca), sodium (Na), titanium (Ti), indium (In), yttrium (Y), lithium (Li), gadolinium (Gd), aluminum (Al), silver (Ag), tin (Sn), and lead (Pb), or an alloy thereof. The second electrode 117 may also be configured by the single stack and configured by the multi-stack formed of the above-mentioned materials.

The organic layer 116 may be formed with a multi-stack tandem structure to improve luminous efficiency. Specifically, the organic layer 116 may be formed with a multi-stack tandem structure including a red organic light emitting layer EML, a green organic light emitting layer EML, and a blue organic light emitting layer EML.

Further, each stack of the organic layer 116 may include an electron injection layer EIL and a hole injection layer HIL which inject electrons and holes to the organic light emitting layer EML, respectively, and an electron transport layer ETL and a hole transport layer HTL which transport the injected electrons and holes to the light emitting layer, respectively, and a charge generating layer CGL which generates charges such as the electrons and the holes. A detailed structure thereof will be described below with reference to FIG. 2.

When a current is applied to the first electrode 115 and the second electrode 117, the electrons are injected from the second electrode 117 to the organic layer 116 and holes are injected from the first electrode 115 to the organic layer 116. Thereafter, excitons are generated in the organic layer 116. As the excitons are decayed, light corresponding to an energy difference of a lowest unoccupied molecular orbital (LUMO) and a highest occupied molecular orbital (HOMO) of the light emitting layer is generated.

Here, it is determined whether the light generated in the organic layer 116 is emitted through the front surface or through the rear surface depending on transmittance and reflectance of the first electrode 115 and the second electrode 117.

In the exemplary aspect of the present disclosure, as described above, the first electrode 115 is a transparent electrode and the second electrode 117 is used as a reflective electrode. Therefore, the light emitted from the organic layer 116 is reflected by the second electrode 117 to be transmitted through the first electrode 115 so that the light is generated to the lower portion of the organic light emitting diode unit 110. That is, the organic light emitting diode unit 110 according to an exemplary aspect of the present disclosure may perform bottom emission.

However, the present disclosure is not limited thereto and the first electrode 115 may be used as a reflective electrode and the second electrode 117 may be used as a transparent electrode so that the organic light emitting diode unit 110 may perform top emission.

Further, the barrier layer 114 is disposed below the first electrode 115 to block moisture, air, or fine particles penetrating from the substrate 111 and the internal light extracting layer 112.

In order to suppress the penetration of moisture and air, the barrier layer 114 may include a plurality of inorganic barrier layers and in order to block the fine particles, the barrier layer 114 may include a plurality of organic barrier layers.

Specifically, the inorganic barrier layer may be formed of one of $Al_2O_3$, $ZrO_2$, $HfO_2$, $TiO_2$, ZnO, $Y_2O_3$, $CeO_2$, $Ta_2O_5$, $La_2O_5$, $Nb_2O_5$, $SiO_2$, and SiNT), which are inorganic insulating materials. The organic barrier layer may be formed of acrylic resin or epoxy resin, and specifically, may be formed of photoacryl (PAC).

The internal light extracting layer 112 is disposed between the substrate 111 and the barrier layer 114 to increase the external extracting efficiency of the light generated from the organic light emitting diode which performs the bottom emission.

The internal light extracting layer 112 inserts titanium oxide $TiO_2$ particles into a resin to increase internal light scattering and surface roughness, thereby increasing optical extraction efficiency. Specifically, the internal light extracting layer 112 may be formed to have a thickness of 450 nm by an inkjet-coating method and a diameter of titanium oxide $TiO_2$ particle may be 200 nm to 300 nm. However, the specific value may vary to various values depending on the necessity of the design of the lighting apparatus 100.

The planarizing layer 113 is disposed on the internal light extracting layer 112 to compensate the surface roughness of the internal light extracting layer 112, thereby improving the reliability of the organic light emitting diode unit 110.

The planarizing layer 113 is configured by inserting zirconia particles into a resin and compensates the surface roughness of the internal light extracting layer 112. Specifically, the planarizing layer 113 may be formed by the inkjet-coating method to have a thickness of 150 nm and a diameter of the zirconia particle may be 50 nm. However, the specific value may vary to various values depending on the necessity of the design of the lighting apparatus 100.

The encapsulating unit 120 covers the organic light emitting diode unit 110 to protect the organic light emitting diode unit 110 by blocking the influence from the outside. The encapsulating unit 120 includes an adhesive layer 121 which is in contact with the organic light emitting diode unit 110, a metal film 122 which is in contact with the adhesive layer 121, and a protective film 123 attached onto the metal film 122.

The adhesive layer 121 may be formed of a pressure sensitive adhesive (PSA) which bonds the metal film 122 and the organic light emitting diode unit 110. A thickness of the adhesive layer 121 may be 30 □ m but is not limited thereto and may vary to various values depending on the necessity of the design of the lighting apparatus 100.

The metal film 122 is disposed on the adhesive layer 121 to maintain the rigidity of the lighting apparatus 100. To this end, the metal film 122 may be formed of copper (Cu) having a thickness of 20 μm but is not limited thereto and may vary in various forms depending on the necessity of the design of the lighting apparatus 100.

The protective film 123 is disposed on the metal film 122 to absorb the external impact of the lighting apparatus 100 and protect the lighting apparatus 100. To this end, the protective film 123 may be formed of a polyethylene terephthalate (PET) film which is a polymer film having a thickness of 100 μm but is not limited thereto and may vary in various forms depending on the necessity of the design of the lighting apparatus 100.

Figure 2:
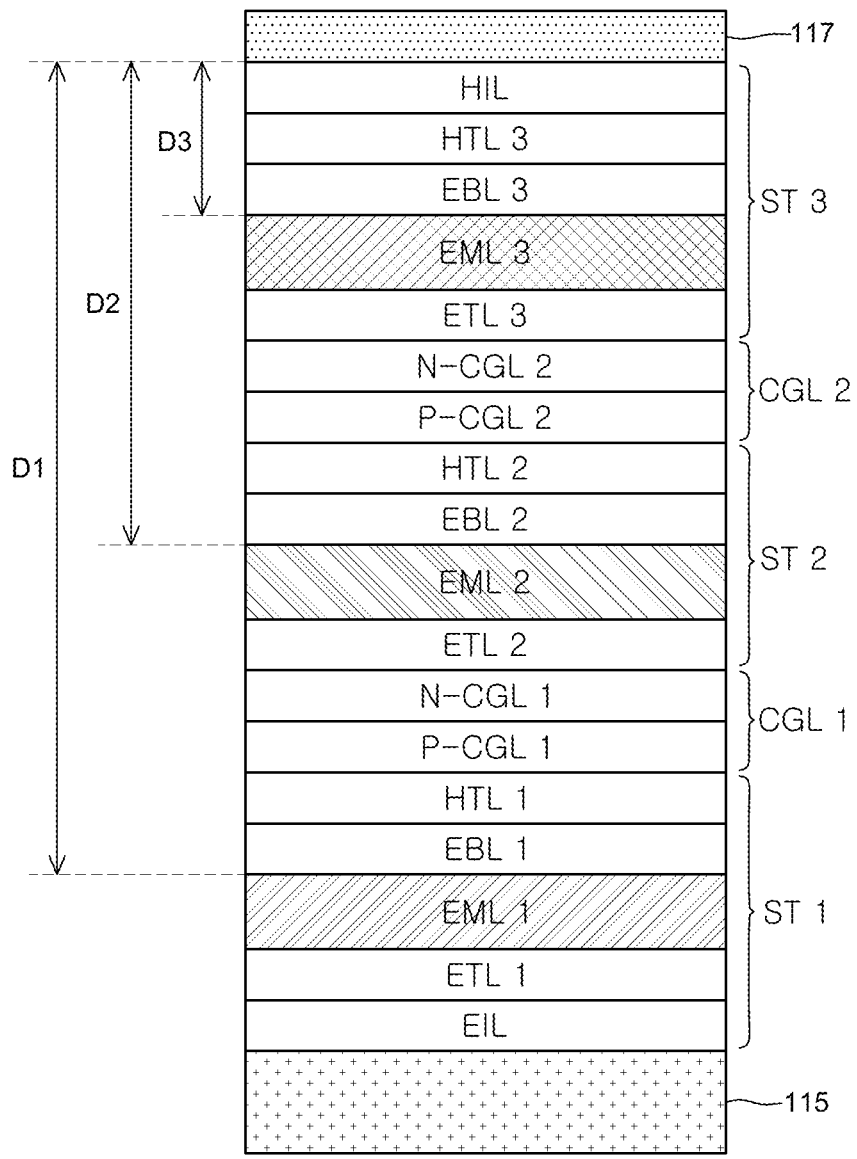
FIG. 2 is a cross-sectional view illustrating a stack structure of an organic layer according to an exemplary aspect of the present disclosure.

FIG. 2 is a cross-sectional view illustrating a stack structure of an organic layer according to an exemplary aspect of the present disclosure;

Specifically, FIG. 2 illustrates an organic layer 116 having a tandem structure including a triple stack.

Referring to FIG. 2, the organic layer 116 includes a first stack ST1 including a first organic light emitting layer EML1, a second stack ST2 including a second organic light emitting layer EML2, a third stack ST3 including a third organic light emitting layer EML3, a first charge generating layer CGL1 disposed between the first stack ST1 and the second stack ST2, and a second charge generating layer CGL2 disposed between the second stack ST2 and the third stack ST3, in the disposed order on the first electrode 115.

The first charge generating layer CGL1 includes a first N-type charge generating layer N-CGL1 and a first P-type charge generating layer P-CGL1 and the first N-type charge generating layer N-CGL1 is in contact with the second electron transport layer ETL2. The first P-type charge generating layer P-CGL1 is disposed between the first N-type charge generating layer N-CGL1 and the first hole transport layer HTL1.

The second charge generating layer CGL2 includes a second N-type charge generating layer N-CGL2 and a second P-type charge generating layer P-CGL2 and the second N-type charge generating layer N-CGL2 is in contact with the third electron transport layer ETL3. The second P-type charge generating layer P-CGL2 is disposed between the second N-type charge generating layer N-CGL2 and the second hole transport layer HTL2.

The first and second charge generating layers CGL1 and CGL2 may be configured by a plurality of layers including first and second N-type charge generating layers N-CGL1 and N-CGL2 and first and second P-type charge generating layers P-CGL1 and P-CGL2, respectively, but it is not limited thereto and may be configured by a single layer.

The first N-type charge generating layer N-CGL1 injects electrons to a second stack ST2 and the second N-type charge generating layer N-CGL2 injects electrons to a third stack ST3. The first N-type charge generating layer N-CGL1 and the second N-type charge generating layer N-CGL2 may include an N-type dopant material and an N-type host material, respectively. The N-type dopant material may be a metal of Group 1 and Group 2 on the periodic table, an organic material which may inject the electrons, or a mixture thereof. For example, the N-type dopant material may be any one of an alkali metal and an alkaline earth metal. Or, the first N-type charge generating layer N-CGL1 may be formed of the organic layer 116 doped with an alkali metal such as lithium (Li), sodium (Na), potassium (K), or cesium (Cs) or an alkali earth metal such as magnesium (Mg), strontium (Sr), barium (Ba), or radium (Ra), but is not limited thereto. The N-type host material may be formed of a material which is capable of transmitting electrons, for example, may be formed of any one or more of Alq$_3$(tris(8-hydroxyquinolino) aluminum), Lig(8-hydroxyquinolinolato-lithium), PBD(2-(4-biphenylyl)-5-(4-tert-butylphenyl)-1,3,4oxadiazole), TAZ(3-(4-biphenyl)4-phenyl-5-tert-butylphenyl-1,2,4-triazole), spiro-PBD, and BAlq(bis(2-methyl-8-quinolinolate)-4-(phenylphenolato)aluminium), SAlq, TPBi(2,2',2-(1,3,5-benzinetriyl)-tris(1-phenyl-1-H-benzimidazole), oxadiazole, triazole, phenanthroline, benzoxazole, and benzthiazole, but is not limited thereto.

The first P-type charge generating layer P-CGL1 injects holes to the first stack ST1 and the second P-type charge generating layer P-CGL2 injects holes to the second stack ST2. The first P-type charge generating layer P-CGL1 and the second P-type charge generating layer P-CGL2 may include a P-type dopant material and a P-type host material. The P-type dopant material may be formed of metal oxide such as V$_2$O$_5$, MoOx, and WO$_3$, an organic material such as tetrafluoro-tetracyanoquinodimethane (F4-TCNQ), HAT-CN (Hexaazatriphenylene-hexacarbonitrile), or hexaazatriphenylene, but is not limited thereto. The P-type host material may be formed of a material which is capable of transmitting holes, for example, may be formed of a material including any one or more of NPD(N,N-dinaphthyl-N,N'-diphenyl benzidine)(N,N'-bis(naphthalene-1-yl)-N,N'-bis(phenyl)-2,2'-dimethylbenzidine), TPD(N,N'-bis-(3-methylphenyl)-N,N'-bis-(phenyl)-benzidine), and MTDATA(4,4',4-Tris(N-3-methylphenyl-N-phenyl-amino)-triphenylamine), but is not limited thereto.

Each stack structure will be described. The first stack ST1 includes an electron injection layer EIL, a first electron transport layer ETL1, a first organic light emitting layer EML1, a first electron blocking layer EBL1, and a first hole transport layer HTL1. The second stack ST2 includes a second electron transport layer ETL2, a second organic light emitting layer EML2, a second electron blocking layer EBL2, and a second hole transport layer HTL2. The third stack ST3 includes a third electron transport layer ETL3, a third organic light emitting layer EML3, a third electron blocking layer EBL3, a third hole transport layer HTL3, and a hole injection layer HIL.

The hole injection layer HIL is an organic layer which smoothly injects the hole from the second electrode 117 to the third organic light emitting layer EML3. The hole injection layer HIL may be formed of a material including any one or more of HAT-CN(dipyrazino[2,3-f:2',3'-h]quinoxaline-2,3,6,7,10.11-hexacarbonitrile), CuPc (phthalocyanine), F4-TCNQ(2,3,5,6-tetrafluoro-7,7,8,8-tetracyano-quinodimethane), and NPD(N,N'-bis(naphthalene-1-yl)-N,N'-bis(phenyl)-2,2'-dimethylbenzidine), but is not limited thereto.

The first to third hole transport layers HTL1, HTL2, and HTL3 are organic layers which smoothly transmit holes to the first to third organic light emitting layers EML1, EML2, and EML3. For example, the first to third hole transport layers HTL1, HTL2, and HTL3 may be formed of a material including any one or more of NPD(N,N'-bis(naphthalene-1-yl)-N,N'-bis(phenyl)-2,2'-dimethylbenzidine), TPD(N,N'-bis-(3-methylphenyl)-N,N'-bis-(phenyl)-benzidine), s-TAD (2,2',7,7'-tetrakis(N,N-dimethylamino)-9,9-spirofluorene), and MTDATA(4,4',4"-Tris(N-3-methylphenyl-N-phenyl-amino)-triphenylamine), but is not limited thereto.

The first to third electron blocking layers EBL1, EBL2, and EBL3 are organic layers which block the electrons injected to the first to third organic light emitting layers EML1, EML2, and EML3 from passing over the first to third hole transport layers HTL1, HTL2, and HTL3. The first to third electron blocking layers EBL1, EBL2, and EBL3 improve the coupling of the holes and electrons in the first to third organic light emitting layers EML1, EML2, and EML3 by blocking the movement of the electrons and improve the emission efficiency of the first to third organic light emitting layers EML1, EML2, and EML3. The first to third electron blocking layers EBL1, EBL2, and EBL3 may be formed of the same material as the first to third hole transport layers HTL1, HTL2, and HTL3. The first to third hole transport layers HTL1, HTL2, and HTL3 and the first to third electron blocking layers EBL1, EBL2, and EBL3 may be formed as separate layers. However, the present disclosure is not limited thereto and the first to third hole transport layers HTL1, HTL2, and HTL3 and the first to third electron blocking layers EBL1, EBL2, and EBL3 may be combined.

In the first to third organic light emitting layers EML1, EML2, and EML3, the holes supplied through the first electrode 115 and the electrons supplied through the second electrode 117 are recombined to generate excitons. Here, an area where the excitons are generated is referred to as an emission area (or emission zone) or a recombination zone.

The first to third organic light emitting layers EML1, EML2, and EML3 are disposed between the first to third hole transport layers HTL1, HTL2, and HTL3 and the first to third electron transport layers ETL1, ELT2, and ELT3 and include a material which emits specific colored light. For example, in the lighting apparatus 100 according to the exemplary aspect of the present disclosure, the first organic light emitting layer EML1 may include a material which emits green light, the second organic light emitting layer EML2 may include a material which emits blue light, and the third organic light emitting layer EML3 may include a material which emits red light.

Here, each of the organic light emitting layers EML1, EML2, and EML3 may have a host-dopant system, that is, a system in which a host material having a large weight ratio is doped with an emission dopant material having a small weight ratio. In this case, each of the organic light emitting layers EML1, EML2, and EML3 may include a plurality of host materials or include a single host material.

For example, in the first organic light emitting layer EML1, a green phosphorescent dopant material is doped. That is, the first organic light emitting layer EML1 is a green light emitting layer and a range of a wavelength of light emitted from the first organic light emitting layer EML1 may be 570 nm to 490 nm.

Specifically, the first organic light emitting layer EML1 includes a host material including carbazole biphenyl (CBP) or mCP(1,3-bis(carbazol-9-yl) and may further include a phosphorescent dopant material including Ir(ppy)3(fac tris (2-phenylpyridine)iridium), Ir(ppy)2(acac), or Ir(mpyp)3, but it is not limited thereto.

Further, in the second organic light emitting layer EML2, a blue phosphorescent dopant material is doped. That is, the second organic light emitting layer EML2 is a blue light emitting layer and a range of a wavelength of light emitted from the second organic light emitting layer EML2 may be 490 nm to 450 nm.

Specifically, the second organic light emitting layer EML2 may include a host material including CBP (carbazole biphenyl) or mCP (1,3-bis(carbazol-9-yl) and may further include a fluorescent dopant material including any one selected from a group consisting of spiro-DPVBi, spiro-6P, distyrylbenzene (DSB), distyrylarylene (DSA), PFO based polymer, and PPV based polymer, but is not limited thereto.

In the third organic light emitting layer EML3, a red phosphorescent dopant material is doped. That is, the third organic light emitting layer EML3 is a red light emitting layer and a range of a wavelength of light emitted from the third organic light emitting layer EML3 may be 720 nm to 640 nm.

Specifically, the third organic light emitting layer EML3 includes a host material including carbazole biphenyl (CBP) or mCP(1,3-bis(carbazol-9-yl)) and may further include a phosphorescent dopant material which includes one or more selected from a group consisting of PIQIr(acac)(bis(1-phenylisoquinoline)acetylaetonate iridium, PQIr(acac)(bis(1-phenylquinoline)acetylacetonate iridium), PQIr(tris(1-phenylquinoline) iridium), and PtOEP(octaethylporphyrin platinum), but is not limited thereto.

The first to third electron transport layers ETL1, ELT2, and ETL3 transmit the electrons from the electron injection layer EIL and the first and second N-type charge generating layers N-CGL1 and N-CGL2 to the organic light emitting layer EML.

Further, the first to third electron transport layers ETL1, ETL2, and ETL3 perform the same function as a hole blocking layer HBL. The hole blocking layer HBL may suppress the holes which do not participate in the recombination from being leaked from the organic light emitting layer EML.

For example, the first to third electron transport layers ETL1, ETL2, and ETL3 may be formed of any one or more of Liq(8-hydroxyquinolinolato-lithium), PBD(2-(4-biphenyl)-5-(4-tert-butylphenyl)-1,3,4-oxadiazole), TAZ(3-(4-biphenyl)4-phenyl-5-tert-butylphenyl-1,2,4-triazole), BCP(2,9-Dimethyl-4,7-diphenyl-1,10-phenanthroline), and BAlq (bis (2-methyl-8-quinolinolate)-4-(phenylphenolato) aluminum), but is not limited thereto.

The electron injection layer EIL is a layer which smoothly injects the electron from the first electrode 115 to the first organic light emitting layer EML1. For example, the electron injection layer EIL may be formed of a material including any one or more of alkali metals or alkaline earth metal ions, such as LiF, BaF2, and CsF, but is not limited thereto.

The electron injection layer EIL and the electron transport layer ETL may be omitted depending on a structure or a characteristic of the lighting apparatus 100 using an organic light emitting diode.

Figure 3A:
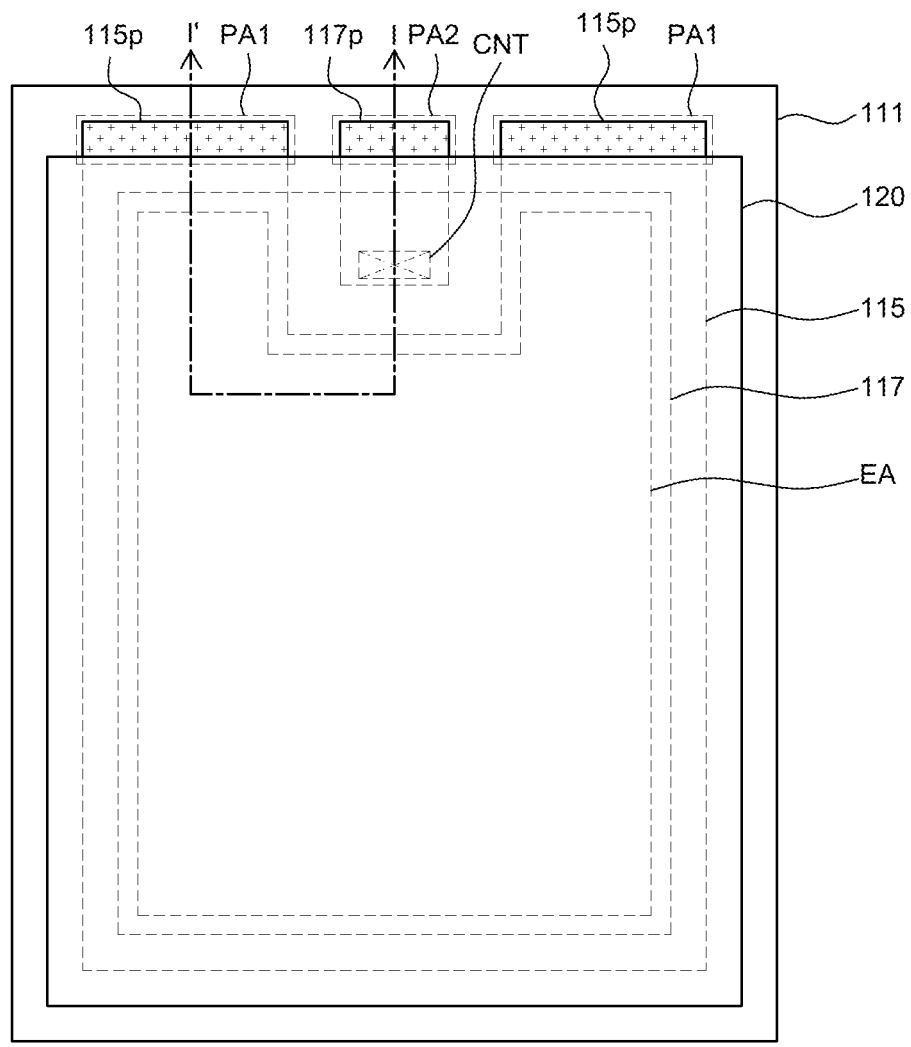
FIG. 3A is a front view of a lighting apparatus using an organic light emitting diode according to an exemplary aspect of the present disclosure.

FIG. 3A is a front view of a lighting apparatus using an organic light emitting diode according to an exemplary aspect of the present disclosure. FIG. 3B is an enlarged view of a lighting unit of a lighting apparatus using an organic light emitting diode according to an exemplary aspect of the present disclosure.

Figure 4:
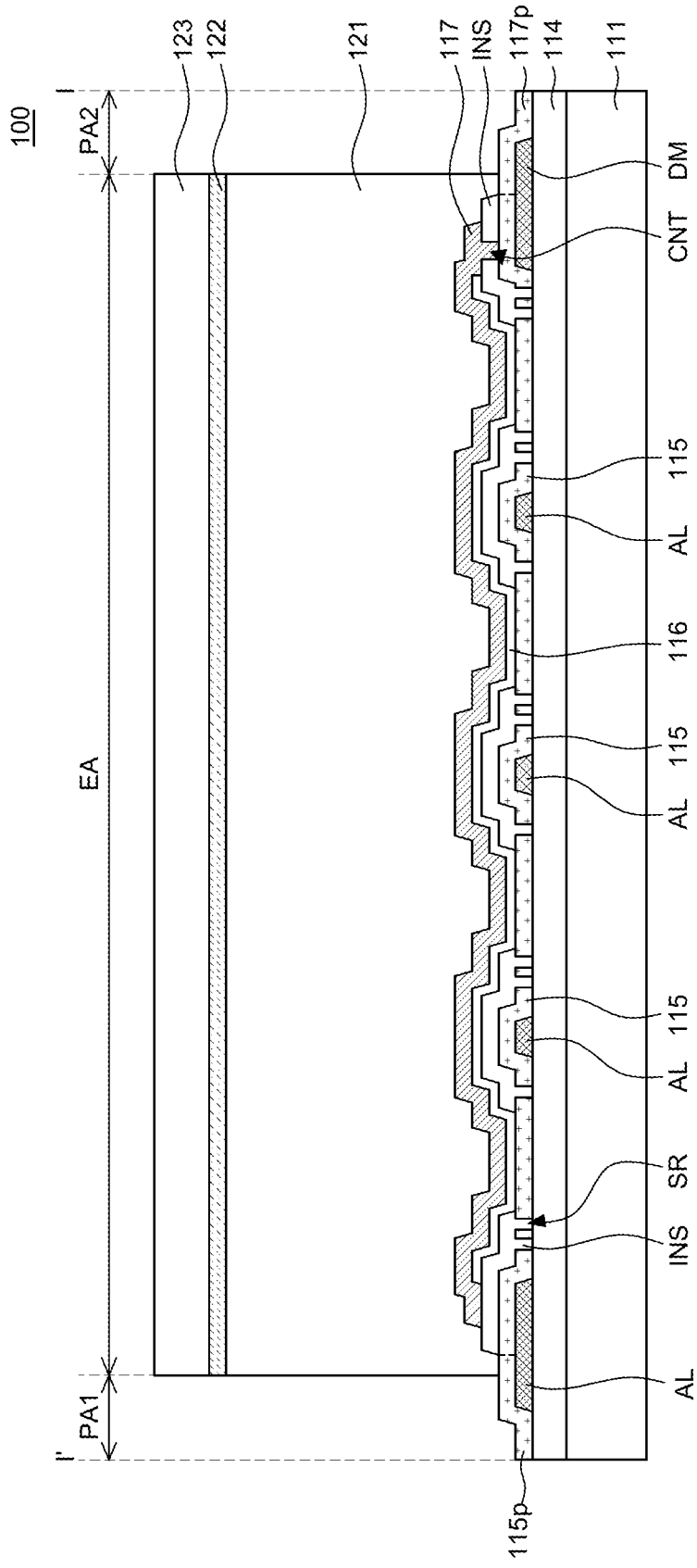
FIG. 4 is a cross-sectional view taken along line I-I' of FIG. 3A.

FIG. 4 is a cross-sectional view taken along line I-I' of FIG. 3A.

Specifically, FIG. 3A illustrates an arrangement relationship of the first electrode 115, the second electrode 117, and the encapsulating unit 120. FIG. 4 explains a connection relationship of the second electrode 117 and a second contact electrode 117p and a connection relationship of the first electrode 115 and a first contact electrode 115p.

As illustrated in FIGS. 3A and 4, the first electrode 115 is disposed on the substrate 111, the second electrode 117 is disposed on the first electrode 115, and the encapsulating unit 120 is disposed so as to cover the second electrode 117.

Here, the overlapping area of the first electrode 115 and the second electrode 117 may be defined as a lighting unit EA where light is generated from the organic layer 116 disposed between the first electrode 115 and the second electrode 117.

In other words, the lighting apparatus 100 according to the present disclosure may be divided into a lighting unit EA which actually emits light to the outside and pad units PA1 and PA2 which are electrically connected to the outside through the first and second contact electrodes 115p and 117p to apply a signal to the lighting unit EA.

The pad units PA1 and PA2 are not blocked by the encapsulation unit such as a metal film 122 so that the pad units PA1 and PA2 may be electrically connected to the outside through the first and second contact electrodes 115p and 117p. Therefore, the metal film 122 may be attached onto the entire surface of the lighting unit EA of the substrate 111 excluding the pad units PA1 and PA2. However, the present disclosure is not limited thereto.

That is, in the pad units PA1 and PA2 at the outer edge of the lighting unit EA, the organic layer 116, the second electrode 117, the adhesive layer 121, and the metal film 122 are not formed so that the first and second contact electrodes 115p and 117p are exposed to the outside.

The pad units PA1 and PA2 may be located outside the lighting unit EA. In FIG. 3A, even though it is illustrated that the second pad unit PA2 is located between the first pad units PA1, the present disclosure is not limited thereto.

Further, in FIG. 3A, even though it is illustrated that the pad units PA1 and PA2 are located only at one outer side of the lighting unit EA, the present disclosure is not limited thereto. Therefore, the pad units PA1 and PA2 of the present disclosure may be disposed in both one outer side and the other outer side of the lighting unit EA. Further, the first pad unit PA1 of the present disclosure may be located at one outer side of the lighting unit EA and the second pad unit PA2 may be located at the other outer side of the lighting unit EA.

With regard to this, the first contact electrode 115*p* disposed in the first pad unit PA1 is formed of the same material on the same layer as the first electrode 115 disposed in the lighting unit EA. Therefore, the first contact electrode 115*p* is formed by the same process when the first electrode 115 is formed, to be electrically connected to the first electrode 115.

The second contact electrode 117*p* disposed in the second pad unit PA2 is formed of the same material on the same layer as the first electrode 115 disposed in the lighting unit EA by the same process. However, the second contact electrode 117*p* is separated from the first electrode 115 and the auxiliary line AL which is electrically connected to the first electrode 115 and is electrically connected to the second electrode 117 through a connecting hole CNT.

Specifically, as illustrated in FIG. 4, the first contact electrode 115*p* is connected to the first electrode 115 and the auxiliary line AL to form an equipotential surface with the first electrode 115. Therefore, the first contact electrode 115*p*, the auxiliary line AL, and the first electrode 115 are electrically connected to each other. Further, the second contact electrode 117*p* is electrically connected to the second electrode 117 and a dummy electrode DM.

The above-mentioned dummy electrode DM is formed of the same material on the same layer as the auxiliary line AL, but is electrically isolated from the auxiliary line AL. Therefore, the first electrode 115 and the second electrode 117 are not electrically connected.

With this connection structure, the first contact electrode 115*p* disposed in the first pad unit PA1 may transmit a signal applied from the outside to the first electrode 115. Further, the second contact electrode 117*p* disposed in the second pad unit PA2 may transmit the signal applied from the outside to the second electrode 117.

In the meantime, the first electrode 115 is formed of a transparent conductive layer to have an advantage in that the emitted light transmits the first electrode, but also have a disadvantage in that an electric resistance is very high as compared with an opaque metal. Therefore, when a large-size lighting apparatus 100 is manufactured, the distribution of the current applied to a large lighting unit EA is not uniform due to high resistance of the transparent high resistive conductive layer. Therefore, the large-size lighting apparatus cannot emit light with uniform luminance due to the current distribution which is not uniform.

Figure 3B:
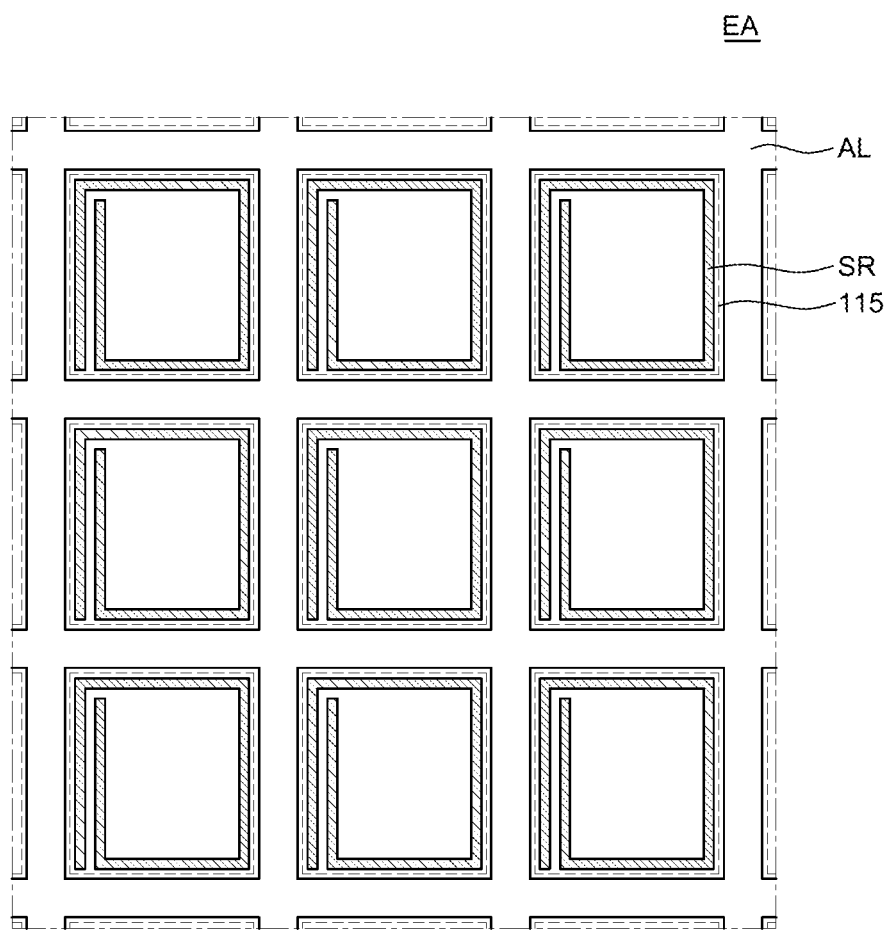
FIG. 3B is an enlarged view of a lighting unit of a lighting apparatus using an organic light emitting diode according to an exemplary aspect of the present disclosure.

Therefore, as illustrated in FIGS. 3B and 4, for the purpose of emission with uniform luminance of the large-size lighting apparatus 100, an auxiliary line AL may be disposed, which is electrically connected to the first electrode 115 and makes the distribution of current applied to the lighting unit EA uniform.

The auxiliary line AL is disposed over the entire lighting unit EA with a net shape, a mesh shape, a hexagonal or octagonal shape, or a circular shape having a small thickness. The auxiliary line AL may be formed of a metal having good conductivity such as aluminum (Al), gold (Au), copper (Cu), titanium (Ti), tungsten (W), molybdenum (Mo), or an alloy thereof. Even though not illustrated in the drawing, the auxiliary line AL may be configured to have a double stack structure of an upper auxiliary line AL and a lower auxiliary line AL, but the present disclosure is not limited thereto, and the auxiliary line may be configured by a single stack.

Here, in FIG. 4, it is illustrated that the auxiliary line AL which is electrically connected to the first electrode 115 is disposed below the first electrode 115 to be in electrical contact with the first electrode 115. However, the present disclosure is not limited thereto, and the auxiliary line AL may be disposed above the first electrode 115.

Further, as illustrated in FIGS. 3B and 4, a short reduction pattern SR is formed in the first electrode 115, to which the current is supplied, to implement a narrow path and the insulating layer INS covers the short reduction pattern SR to suppress the short of the entire panel. That is, the short reduction pattern SR is formed to enclose an outer edge of the emission area of the individual pixel and make the part of the anode inside the short reduction pattern and the part of the anode outside the short reduction pattern connect to each other through a narrow path, and thus adds a resistance to the individual pixels to restrict current flowing in an area where the short is generated.

An insulating layer INS is disposed between the first electrode 115 and the second electrode 117 where the auxiliary line AL of the lighting unit EA is disposed to suppress the short between the first electrode 115 and the second electrode 117 due to the damage of the organic layer 116.

Specifically, the insulating layer INS is configured to cover the auxiliary line AL and the first electrode 115. As described above, the insulating layer INS is formed so as to enclose the auxiliary line AL to reduce the step due to the auxiliary line AL. Therefore, various layers which are formed on the insulating layer INS thereafter may be stably formed without being shorted.

Here, the insulating layer INS may be configured by an inorganic material such as silicon oxide $SiOx$ or silicon nitride $SiNx$. However, the insulating layer INS may be configured by an organic layer such as photoacryl PAC and also configured by a plurality of layers of inorganic layers and organic layers.

Hereinafter, an arrangement relationship of an organic light emitting layer of a lighting apparatus including an organic light emitting diode according to an exemplary aspect of the present disclosure will be described in detail with reference to FIGS. 5 and 6.

Figure 5:
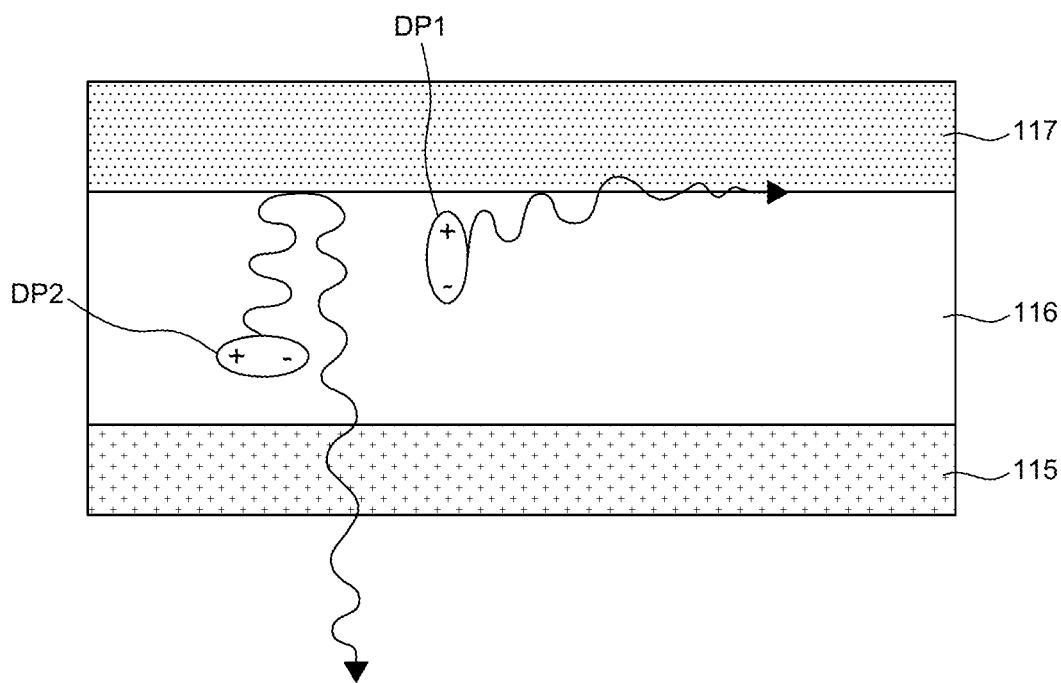
FIG. 5 is a view for explaining a relationship of a degree of horizontal orientation of a dopant and a light loss at an interface of an organic layer and a second electrode.

FIG. 5 is a view for explaining a relationship of a degree of horizontal orientation of a dopant and a light loss at an interface of an organic layer and a second electrode.

As described above, in the lighting apparatus using an organic light emitting diode according to an exemplary aspect of the present disclosure, the third organic light emitting layer EML3 which is a red phosphorescent light emitting layer, the second organic light emitting layer EML2 which is a blue fluorescent light emitting layer, and the first organic light emitting layer EML1 which is a green phosphorescent light emitting layer are disposed in this order from the second electrode 117.

That is, the lighting apparatus 100 using an organic light emitting diode according to an exemplary aspect of the present disclosure includes the first organic light emitting layer EML1 and the third organic light emitting layer EML3 which are phosphorescent light emitting layers and the second organic light emitting layer EML2 which is a fluorescent light emitting layer.

Here, the first organic light emitting layer EML1 may be defined as a first phosphorescent light emitting layer and the third organic light emitting layer EML3 may be defined as a second phosphorescent light emitting layer.

Here, the fluorescent light emitting layer emits light by singlet excitons so that an internal quantum efficiency (IQE)

is 25%. In contrast, the phosphorescent light emitting layer emits light by triplet excitons so that the internal quantum efficiency (IQE) is 100%.

However, in the case of the fluorescent light emitting layer, the internal quantum efficiency (IQE) is increased using delayed fluorescence. However, generally, the internal quantum efficiency (IQE) of the phosphorescent light emitting layer is twice of the internal quantum efficiency (IQE) of the fluorescent light emitting layer, so that the emission efficiency of the lighting apparatus 100 using an organic light emitting diode is determined by the emission efficiency of the phosphorescent light emitting layer.

Therefore, hereinafter, after explaining an arrangement relationship of the first organic light emitting layer EML1 and the third organic light emitting layer EML3 which are phosphorescent light emitting layers, the arrangement relationship of the second organic light emitting layer EML2 which is a fluorescent light emitting layer will be described.

A degree of horizontal orientation of a red phosphorescent dopant included in the third organic light emitting layer EML3 is higher than a degree of horizontal orientation of the green phosphorescent dopant included in the first organic light emitting layer EML1. For example, the degree of horizontal orientation of the red phosphorescent dopant included in the third organic light emitting layer EML3 may be 87% and the degree of horizontal orientation of the green phosphorescent dopant included in the first organic light emitting layer EML1 may be 75%.

Here, the degree of horizontal orientation of the dopant refers to a degree of an average horizontal orientation of a dipole direction of the dopant with respect to a reference plane when an interface of the organic layer 116 and the second electrode 117 which is a reflective electrode is set as a reference plane.

That is, as illustrated in FIG. 5, when a dipole direction of a first dopant DP1 is vertical to the reference plane, a degree of horizontal orientation of the first dopant DP1 is 0%. When a dipole direction of a second dopant DP2 is horizontal to the reference plane, a degree of horizontal orientation of the second dopant DP2 is 100%.

A surface plasmon polariton (SPP) loss at the interface of the organic layer 116 and the second electrode 117 which is a reflective electrode will be described based on them.

First, in the case of the first dopant DP1 having a degree of horizontal orientation of 0%, the generated light (electromagnetic wave) travels in a horizontal direction of the interface of the organic layer 116 and the second electrode 117. Therefore, the light is coupled to surface plasmon which is a vibration of free electrons on the interface to be in a surface plasmon polariton (SPP) state. The more the surface plasmon polariton (SPP), the more the loss by the second electrode 117. Therefore, the emission efficiency of light generated by the first dopant DP1 having a low degree of horizontal orientation is lowered.

In contrast, in the case of the second dopant DP2 having a degree of horizontal orientation of 100%, the generated light (electromagnetic wave) travels in a vertical direction of the interface of the organic layer 116 and the second electrode 117. Therefore, the light is reflected by the second electrode 117 which is a reflective electrode so that the light loss is not caused by the surface plasmon polariton (SPP) state and the light is extracted to the outside. Therefore, the emission efficiency of the light generated by the second dopant DP2 having a high degree of horizontal orientation is improved.

As a result, only when a phosphorescent light emitting layer having a high degree of horizontal orientation, among the plurality of phosphorescent light emitting layers, is disposed to be adjacent to the second electrode 117, the light loss by the surface plasmon polariton (SPP) state is minimized. Therefore, the entire emission efficiency of the lighting apparatus 100 is improved.

Therefore, as described above, the degree of horizontal orientation of the red phosphorescent dopant included in the third organic light emitting layer EML3 is higher than the degree of horizontal orientation of the green phosphorescent dopant included in the first organic light emitting layer EML1. Therefore, the third organic light emitting layer EML3 may be disposed to be more adjacent to the second electrode 117 which is a reflective electrode than the first organic light emitting layer EML1.

Figure 6:
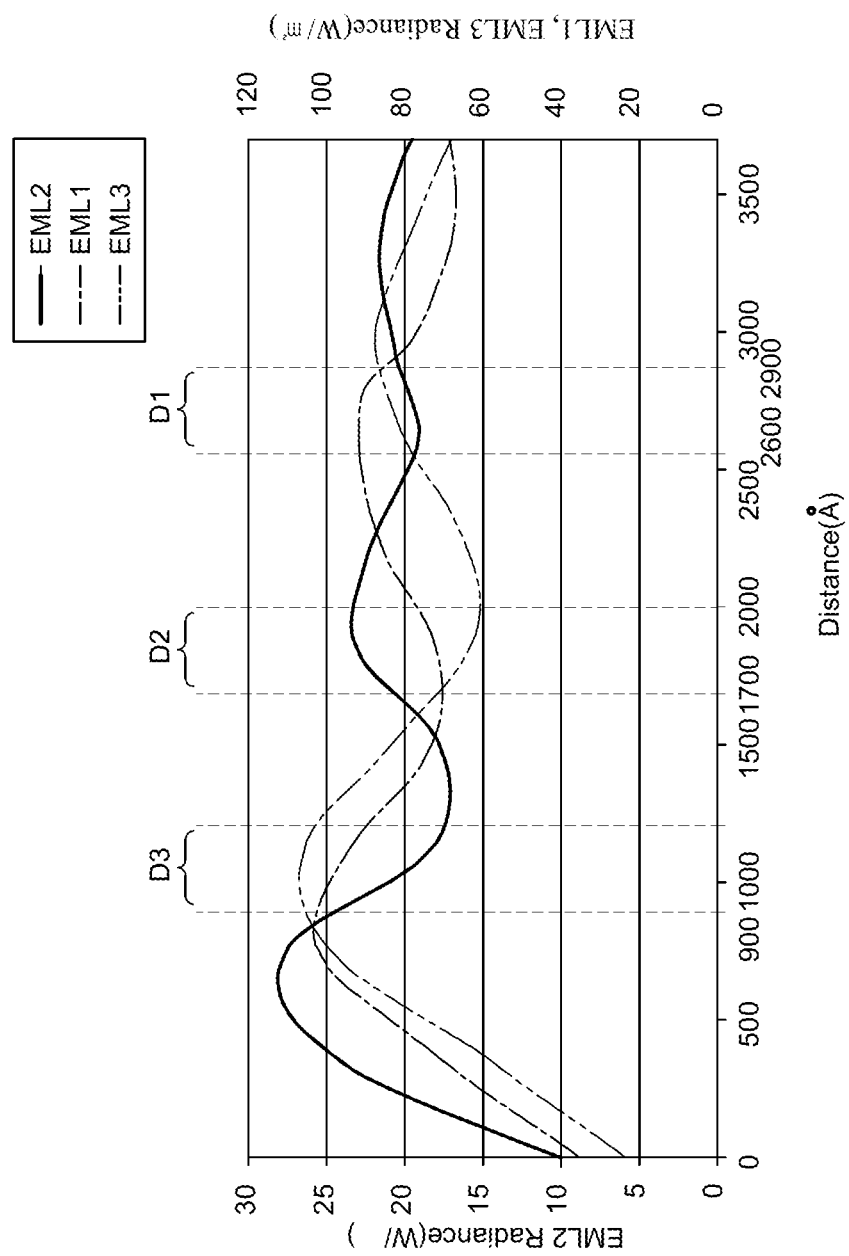
FIG. 6 is a graph illustrating luminous efficiency depending on a distance between an organic light emitting layer and a second electrode.

FIG. 6 is a graph illustrating luminous efficiency depending on a distance between an organic light emitting layer and a second electrode.

Referring to FIG. 6, the first, the second and the third organic light emitting layers each has a first emission efficiency peak at a first distance from the cathode and a second emission efficiency peak at a second distance from the cathode. The maximum emission efficiency of the first organic light emitting layer EML1 represented by a one-dot chain line is 105 W/m$^2$ and maximum emission efficiency of the third organic light emitting layer EML3 represented by a two-dot chain line is 110 W/m$^2$. Therefore, the third organic light emitting layer EML3 having higher maximum emission efficiency is disposed to be most adjacent to the second electrode 117 so that the entire efficiency of the lighting apparatus 100 using an organic light emitting diode according to an exemplary aspect of the present disclosure may be improved.

Referring to FIG. 2, a distance D3 from a bottom surface of the second electrode 117 to a top surface of the third organic light emitting layer EML3 is 900 Å to 1200 Å, at which the first emission efficiency peak of the third organic light emitting layer EML3 is located.

The first organic light emitting layer EML1 may be disposed in the section of 2600 Å to 2900 Å which is a position representing a second maximum emission efficiency of 90 W/m$^2$. That is, a distance D1 from the bottom surface of the second electrode 117 to a top surface of the first organic light emitting layer EML1 is 2600 Å to 2900 Å, at which the second emission efficiency peak of the first organic light emitting layer EML1 is located.

Separately, the second organic light emitting layer EML2 which is the blue fluorescent organic light emitting layer has maximum emission efficiency of 27 W/m$^2$ in a position spaced apart from the second electrode by 700 Å. However, in this arrangement section, the third organic light emitting layer EML3 is disposed as described above so that the second organic light emitting layer EML2 may be disposed in a section of 1700 Å to 2000 Å which represents second maximum emission efficiency of 23 W/m$^2$. That is, a distance D2 from the bottom surface of the second electrode 117 to the top surface of the second organic light emitting layer EML2 is 1700 Å to 2000 Å, at which the second emission efficiency peak of the second organic light emitting layer EML2 is located.

In summary, the third organic light emitting layer EML3 which is a red phosphorescent light emitting layer having a high degree of horizontal orientation is disposed in a distance of 900 Å to 1200 Å from the second electrode 117. The second organic light emitting layer EML2 which is a blue fluorescent light emitting layer is disposed in a distance of 1700 Å to 2000 Å from the second electrode 117. Further, the first organic light emitting layer EML1 which is a green phosphorescent light emitting layer having a low degree of horizontal orientation is disposed in a distance of 2600 Å to 2900 Å from the second electrode 117. Therefore, the loss of the surface plasmon polariton (SPP) state of the lighting apparatus 100 using an organic light emitting diode according to an exemplary aspect of the present disclosure is minimized, thereby improving the entire emission efficiency.

The exemplary aspects of the present disclosure can also be described as follows:

According to an aspect of the present disclosure, a lighting apparatus using an organic light emitting diode includes: a substrate; a first electrode disposed on the substrate; an organic layer which is disposed on the first electrode and includes a plurality of phosphorescent light emitting layers; and a second electrode disposed on the organic layer, and a phosphorescent light emitting layer having a highest degree of horizontal orientation of a dopant among the plurality of phosphorescent light emitting layers is disposed to be adjacent to the second electrode. Therefore, the emission efficiency of the lighting apparatus may be improved.

The second electrode is formed of a reflective metal.

The organic layer further includes at least one fluorescent light emitting layer.

The plurality of phosphorescent light emitting layers includes a first phosphorescent light emitting layer and a second phosphorescent light emitting layer having a dopant having a higher degree of horizontal orientation than that of the first phosphorescent light emitting layer, the first phosphorescent light emitting layer is disposed on the first electrode, at least one fluorescent light emitting layer is disposed on the first phosphorescent light emitting layer, the second phosphorescent light emitting layer is disposed on the at least one fluorescent light emitting layer, and the second electrode is disposed on the second phosphorescent light emitting layer.

The first phosphorescent light emitting layer may emit green light, the at least one fluorescent light emitting layer may emit blue light, and the second phosphorescent light emitting layer may emit red light.

A distance between a bottom surface of the second electrode and a top surface of the first phosphorescent light emitting layer may range from 2600 Å to 2900 Å.

A distance between a bottom surface of the second electrode and a top surface of the second phosphorescent light emitting layer may range from 900 Å to 1200 Å.

A distance between a bottom surface of the second electrode and the at least one fluorescent light emitting layer may range from 1700 Å to 2000 Å.

The first electrode may include a short reduction pattern which implements a narrow path.

According to another aspect of the present disclosure, a lighting apparatus using a three-stack tandem type organic light emitting diode, a first stack adjacent to a transparent electrode includes a green phosphorescent light emitting layer, a third stack adjacent to a reflective electrode includes a red phosphorescent light emitting layer, and a second stack disposed between the first stack and the third stack includes a blue fluorescent light emitting layer. Therefore, the emission efficiency of the lighting apparatus may be improved.

A degree of horizontal orientation of a dopant of the red phosphorescent light emitting layer may be higher than that of the green phosphorescent light emitting layer.

A distance between a bottom surface of the reflective electrode and a top surface of the green phosphorescent light emitting layer may range from 2600 Å to 2900 Å.

A distance between a bottom surface of the reflective electrode and a top surface of the red phosphorescent light emitting layer may range from 900 Å to 1200 Å.

A distance between a bottom surface of the reflective electrode and the blue fluorescent light emitting layer may range from 1700 Å to 2000 Å.

What is claimed is:

1. An organic light emitting diode, comprising:
   an anode;
   an organic layer disposed on the anode and including a first phosphorescent light emitting layer, a fluorescent light emitting layer and a second phosphorescent light emitting layer; and
   a cathode disposed on the organic layer and formed of a reflective metal,
   wherein the first phosphorescent light emitting layer is disposed to be adjacent to the anode,
   wherein the second phosphorescent light emitting layer is disposed to be adjacent to the cathode,
   wherein the anode includes a short reduction pattern which implements a narrow path, and
   wherein a degree of horizontal orientation of a phosphorescent dopant included in the second phosphorescent light emitting layer is higher than a degree of horizontal orientation of a phosphorescent dopant included in the first phosphorescent light emitting layer.

2. The organic light emitting diode according to claim 1, wherein a distance between a bottom surface of the cathode and a top surface of the second phosphorescent light emitting layer ranges from 900 Å to 1200 Å.

3. The organic light emitting diode according to claim 1, wherein a distance between a bottom surface of the cathode and a top surface of the first phosphorescent light emitting layer ranges from 2600 Å to 2900 Å.

4. The organic light emitting diode according to claim 1, wherein a distance between a bottom surface of the cathode and a top surface of the fluorescent light emitting layer ranges from 1700 Å to 2000 Å.

5. The organic light emitting diode according to claim 1, wherein the second phosphorescent light emitting layer is a red phosphorescent light emitting layer, the first phosphorescent light emitting layer is a green phosphorescent light emitting layer, and the fluorescent light emitting layer is a blue fluorescent light emitting layer.

6. The organic light emitting diode according to claim 1, wherein the short reduction pattern encloses an outer edge of the emission area of a pixel and makes thea part of the anode inside the short reduction pattern and another part of the anode outside the short reduction pattern connect to each other through the narrow path.

7. A lighting apparatus, comprising the organic light emitting diode according to claim 1.

8. An organic light emitting diode, comprising:
   an anode;
   an organic layer disposed on the anode and including a first phosphorescent light emitting layer, a fluorescent light emitting layer and a second phosphorescent light emitting layer; and
   a cathode disposed on the organic layer and formed of a reflective metal,
   wherein each of the first phosphorescent light emitting layer, the fluorescent light emitting layer and the second phosphorescent light emitting layer has a first emission efficiency peak at a first distance from the cathode and a second emission efficiency peak at a second distance from the cathode, wherein the first distance of the first phosphorescent light emitting layer is smaller than the first distance of the second phosphorescent light emitting layer, and wherein a degree of horizontal orientation of a phosphorescent dopant included in the first phosphorescent light emitting layer is higher than a degree of horizontal orientation of a phosphorescent dopant included in the second phosphorescent light emitting layer so that a light loss by the surface plasmon polariton (SPP) at an interface of the organic layer and the cathode is minimized.

9. The organic light emitting diode according to claim 8, wherein a position of the second emission efficiency peak of the fluorescent light emitting layer is located between a position of the first emission efficiency peak of the first phosphorescent light emitting layer and a position of the second emission efficiency peak of the first phosphorescent light emitting layer.

10. The organic light emitting diode according to claim 8, wherein the position of the second emission efficiency peak of the fluorescent light emitting layer is located between the position of the first emission efficiency peak of the second phosphorescent light emitting layer and the position of the second emission efficiency peak of the second phosphorescent light emitting layer.

11. The organic light emitting diode according to claim 8, wherein the first phosphorescent light emitting layer emits red light, the fluorescent light emitting layer emits blue light, and the second phosphorescent light emitting layer emits green light.

12. The organic light emitting diode according to claim 8, wherein a distance between a bottom surface of the cathode and a top surface of the first phosphorescent light emitting layer ranges from 900 Å to 1200 Å, at which the first emission efficiency peak of the first phosphorescent light emitting layer is located.

13. The organic light emitting diode according to claim 8, wherein a distance between a bottom surface of the cathode and a top surface of the second phosphorescent light emitting layer ranges from 2600 Å to 2900 Å, at which the second emission efficiency peak of the second phosphorescent light emitting layer is located.

14. The organic light emitting diode according to claim 8, wherein a distance between a bottom surface of the cathode and the fluorescent light emitting layer ranges from 1700 Å to 2000 Å, at which the second emission efficiency peak of the fluorescent light emitting layer is located.

15. The organic light emitting diode according to claim 8, wherein the anode includes a short reduction pattern which implements a narrow path.

* * * * *